United States Patent [19]

Uchida

[11] 4,168,537
[45] Sep. 18, 1979

[54] NONVOLATILE MEMORY SYSTEM ENABLING NONVOLATILE DATA TRANSFER DURING POWER ON

[75] Inventor: Yukimasa Uchida, Yokohama, Japan

[73] Assignee: Tokyo Shibaura Electric Co., Ltd., Kawasaki, Japan

[21] Appl. No.: 778,023

[22] Filed: Mar. 15, 1977

Related U.S. Application Data

[63] Continuation-in-part of Ser. No. 681,557, Apr. 29, 1976, Pat. No. 4,044,343.

[30] Foreign Application Priority Data

Mar. 15, 1976 [JP] Japan .................................. 51-27100

[51] Int. Cl.² ........................ G11C 7/00; G11C 11/34
[52] U.S. Cl. .................................... 365/154; 365/184; 365/191; 365/203
[58] Field of Search ..... 340/173 R, 173 CA, 173 FF; 307/238, 279; 365/95, 184, 154, 203, 205, 191, 202

[56] References Cited

U.S. PATENT DOCUMENTS

| | | | |
|---|---|---|---|
| 3,636,530 | 1/1972 | Mark et al. | 340/173 FF |
| 3,651,492 | 3/1972 | Lockwood | 340/173 FF |
| 3,760,380 | 9/1973 | Hoffman et al. | 340/173 R |
| 3,795,898 | 3/1974 | Mehta et al. | 365/154 X |
| 3,838,295 | 9/1974 | Lindell | 365/205 X |
| 3,949,381 | 4/1976 | Dennard et al. | 365/154 |
| 3,953,839 | 4/1976 | Dennison et al. | 340/173 FF |
| 4,044,343 | 8/1977 | Uchida | 340/173 FF |

FOREIGN PATENT DOCUMENTS

2638703 3/1977 Fed. Rep. of Germany ........... 365/184

Primary Examiner—Alfred H. Eddleman
Assistant Examiner—Donald McElheny, Jr.
Attorney, Agent, or Firm—Cushman, Darby & Cushman

[57] ABSTRACT

A nonvolatile memory system includes a memory array. The unit memory cell includes a bistable circuit having a pair of bistable output points and at least one pair of variable threshold field effect elements connected to the bistable points. The memory system further includes, decoders for selecting at least one unit cell, a pair of data lines to be connected to the digit lines of the selected unit cell or cells, a first means for driving the decoders to select at least one unit cell, a second means, external to the memory cells, for causing the bistable points in the selected memory cell or cells to be set to a ground reference level through the digit lines, and a third means for causing a read control signal from a corresponding control signal generator to be supplied to the variable threshold field effect elements so as to transfer data stored in the threshold field effect elements to the bistable points. The second means allows the bistable points to be set to the reference potential and any non-volatile memory cell can be read at any desired time during the "ON" state of the power supply source. Since the second means is external to the memory cells, a conventional memory cell array can be used without modification, and no great chip area is required in arranging such cells. During a read or write transfer between the bistable points and non-volatile memory cell sections it is possible to select individual unit cells or all cells at once.

11 Claims, 8 Drawing Figures

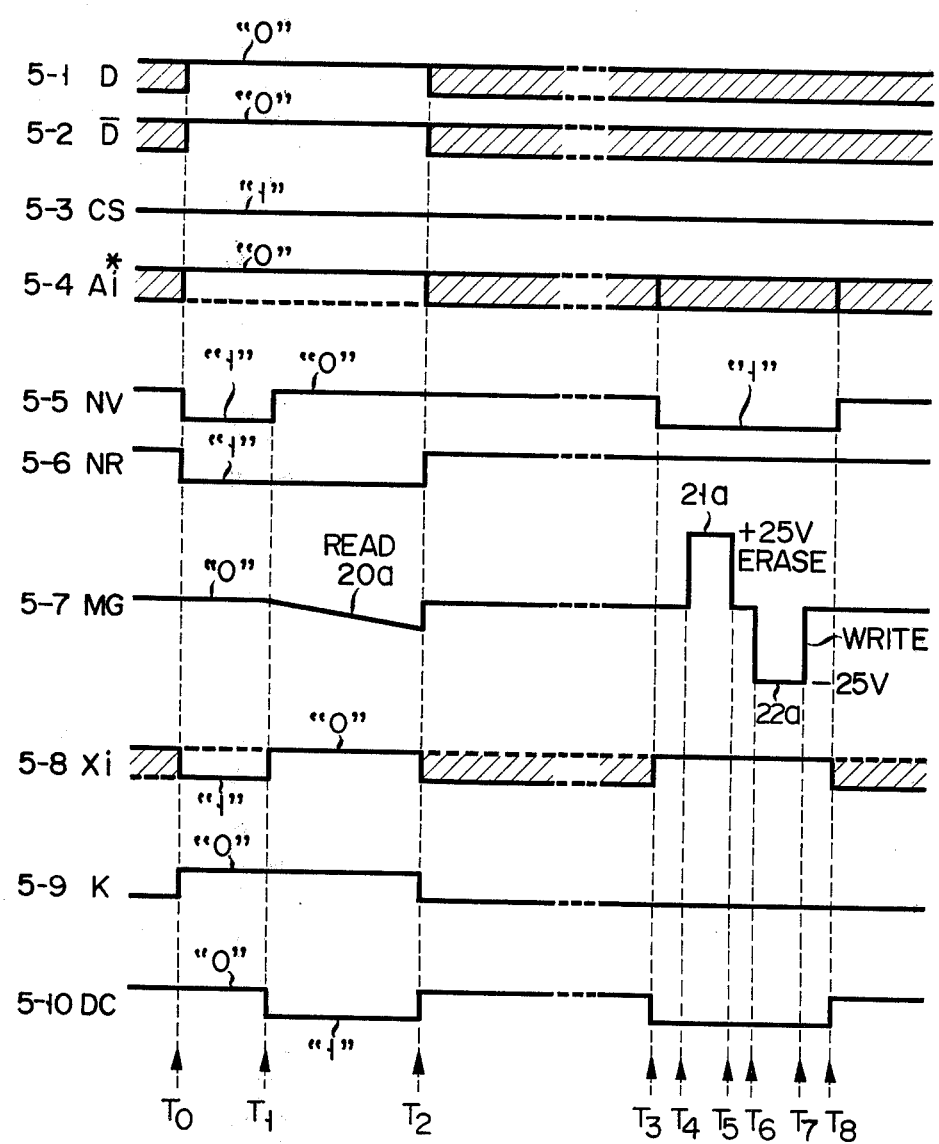

NONVOLATILE MEMORY SYSTEM ENABLING NONVOLATILE DATA TRANSFER DURING POWER ON

This application is a Continuation-In-Part of copending application Ser. No. 681,557 filed Apr. 29, 1976, now issued as U.S. Pat. No. 4,044,343.

This invention relates to a nonvolatile memory system and in particular a nonvolatile memory system which permits at least one nonvolatile data and one volatile data to be mutually independently stored in each unit memory cell constituting a memory array, and which permits the nonvolatile data to be read out as a volatile data and the volatile data to be written as a nonvolatile data.

As is known that in a unit memory cell comprised of a combination of a bistable circuit and nonvolatile memory elements a volatile data is stored in the bistable circuit and a nonvolatile data in the nonvolatile memory elements. That is, with a power source in the ON state the volatile data is stored in the bistable circuit and with the power source in the OFF state the volatile data is written into the nonvolatile memory elements. When the power source is again in the ON state the data written in the nonvolatile memory elements is read as a volatile data onto the bistable circuit. The unit memory cell of such type is disclosed in an article "Nonvolatile Static Random Access Memory with MNOS Memory Transistors" by S. Saito, N. Endo, Y. Uchida, T. Tanaka, Y. Nishi and K. Tamaru, "Digest of Tech. papers The 7th Conf. on Solid State Devices," Tokyo, Sept. 1975, (A-5-3, pp. 57). Such unit memory cells are arranged in a matrix array to provide a nonvolatile memory system. In the above-mentioned unit memory cell, however, a volatile data on the bistable circuit is written in the nonvolatile memory elements only when the power source is in the OFF state and, with the power source in the ON state, the nonvolatile data is read onto the bistable circuit, thereby preventing the disappearance of the volatile data on the bistable circuit.

In an electronic computer, on the other hand, a volatile data at a given time is stored as a nonvolatile data in order to prevent an irrecoverable destruction of a desired data by an erroneous operation of a computer. When the volatile data is destroyed by erroneous treatment, the stored nonvolatile data is returned as a volatile data to the bistable circuit and reprocessing is effected based on the returned volatile data. In this method, however, the volatile data is transferred from a main memory to an auxiliary memory (for example, a disk memory) and stored there as a nonvolatile data. Any data for storage, which is not used at all times, is transferred to, and stored in, an inexpensive auxiliary memory so that an expensive main memory can be effectively used. According to this method a data transfer system is very complicated and a data processing operation of the computer must be stopped during a time period required for data transfer. A memory system will find a wide application if in a memory system having nonvolatile memory element connected to bistable points in each unit memory cell a volatile data is stored at a desired time as a nonvolatile data and read out at another desired time as a volatile data. It is accordingly the object of this invention to provide a nonvolatile memory system including unit memory cells having at least one variable threshold field effect element connected to each of bistable points in a bistable circuit, in which a volatile data is written at a desired time as a nonvolatile data in the element and a nonvolatile data is read out at another desired time onto the bistable point in the bistable circuit.

According to this invention, there is provided a nonvolatile memory system comprising a memory array including a plurality of unit memory cells arranged in a matrix array, each unit memory cell comprising a bistable circuit and a first and second switching transistors, the bistable circuit having a pair of bistable points, at least one pair of variable threshold field effect elements each having a first electrode connected to a corresponding bistable point and a pair of switching transistors having first and second electrodes, and first electrodes of the first and second transistors being connected to the bistable points respectively; a plurality of pairs of digit lines, each pair being connected one to a corresponding second electrode of the first and second switching transistors in each unit memory cell in the column direction of the memory matrix array; a plurality of word lines, each connected in common to the gates of the first and second switching transistors in each unit memory cell in the row direction of the memory matrix array; a first decoder for selecting at least one pair from said plurality of pairs of digit lines; a second decoder for selecting at least one of said plurality of word lines; a pair of data lines for transferring data to at least one pair of digit lines selected by the output of the first decoder; control signal generating means for supplying a control signal to the variable threshold field effect elements in each unit memory cell; first means for selecting at least one unit memory cell through said first and second decoders in response to an input address signal; second means for causing the bistable points in the selected cell or cells to be set to the reference level through the digit lines; and third means for causing a readout signal from the control signal generating means to be supplied to each variable threshold field effect element after the bistable points are set to the reference level.

According to this invention, data stored in the variable threshold field effect elements can be read at a very brief time period onto the bistable points in the bistable circuit in each unit memory cell, since means is provided for causing potential level on the bistable points in the bistable circuit to be set to a reference level. In consequence, data on the bistable points which have been written at a desired time in the field effect elements can be read at another desired time onto the bistable points without giving any influence to data processing. Furthermore, a plurality of variable threshold field effect elements can be connected to each bistable point and a different data be written at a different time into the corresponding pair of variable threshold field effect elements so that a corresponding different data can be read at a different time onto each bistable points in a bistable circuit in each unit memory cell.

This invention will be further described by way of example by referring to the accompanying drawings in which.

Figure 4A:
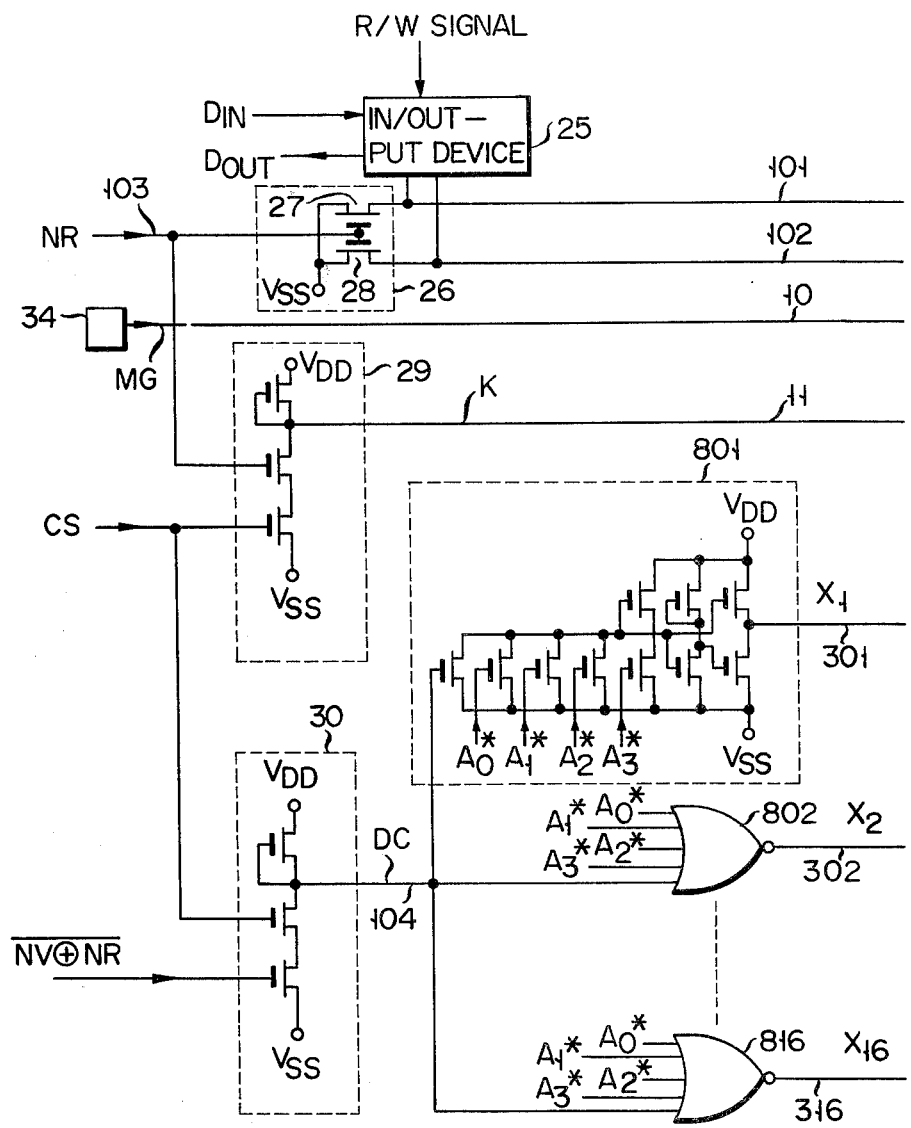
Figure 4B:
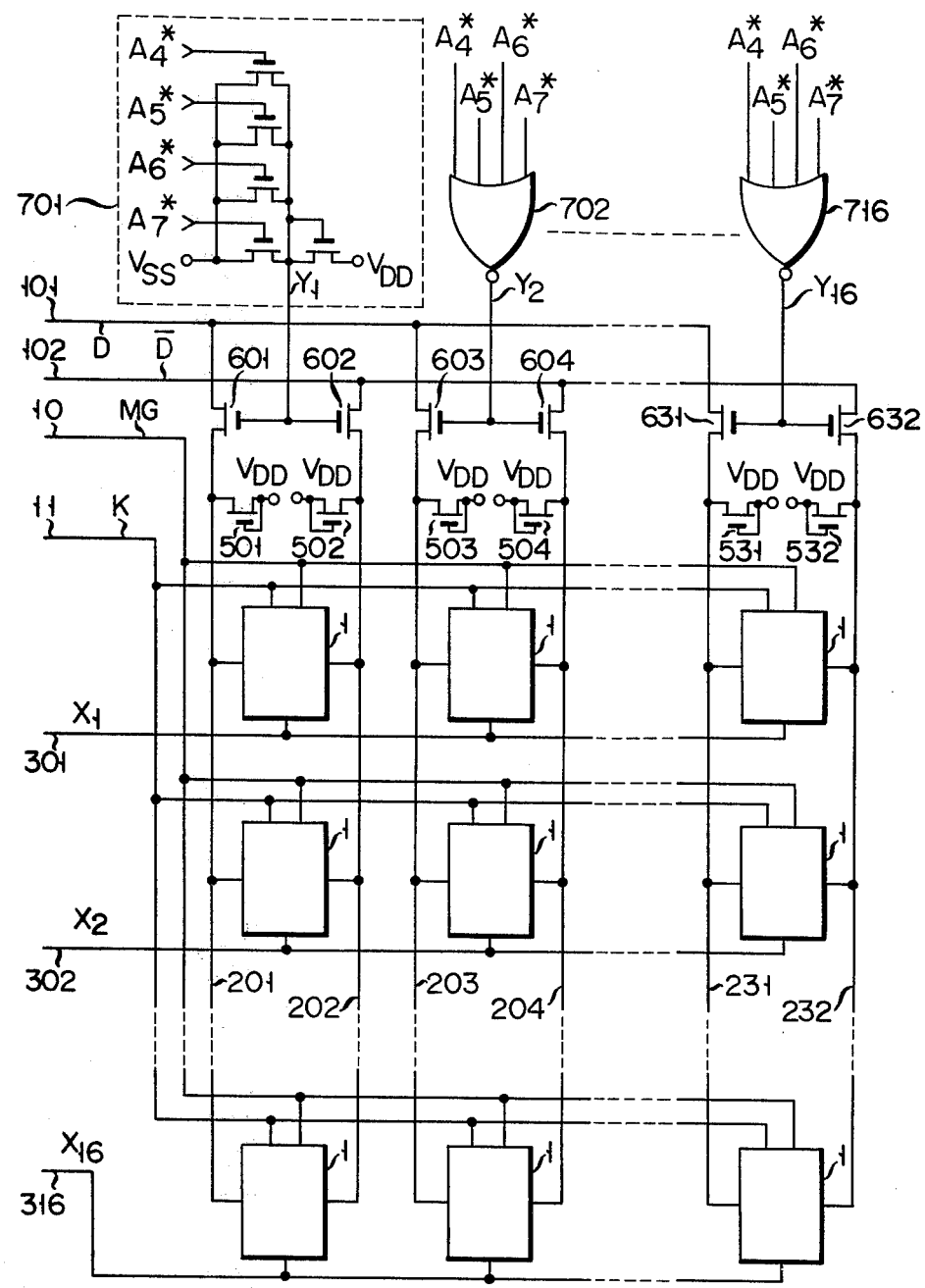
Figure 4C:
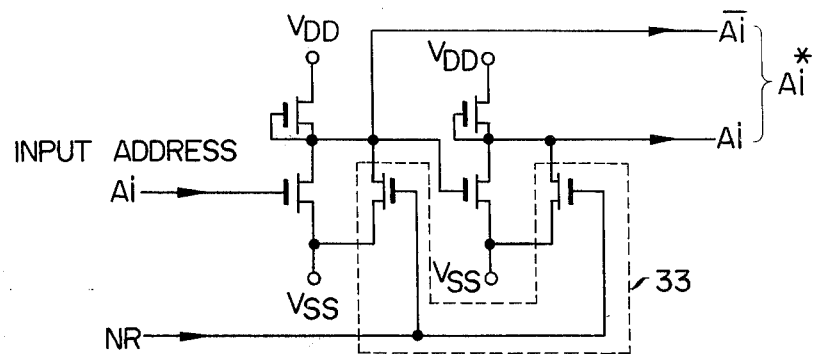

FIGS. 4A, 4B and 4C, each, show a circuit diagram showing one embodiment of this invention;

FIG. 5 is a timing chart showing various signals in FIGS. 4A to 4C; and

Figure 6:
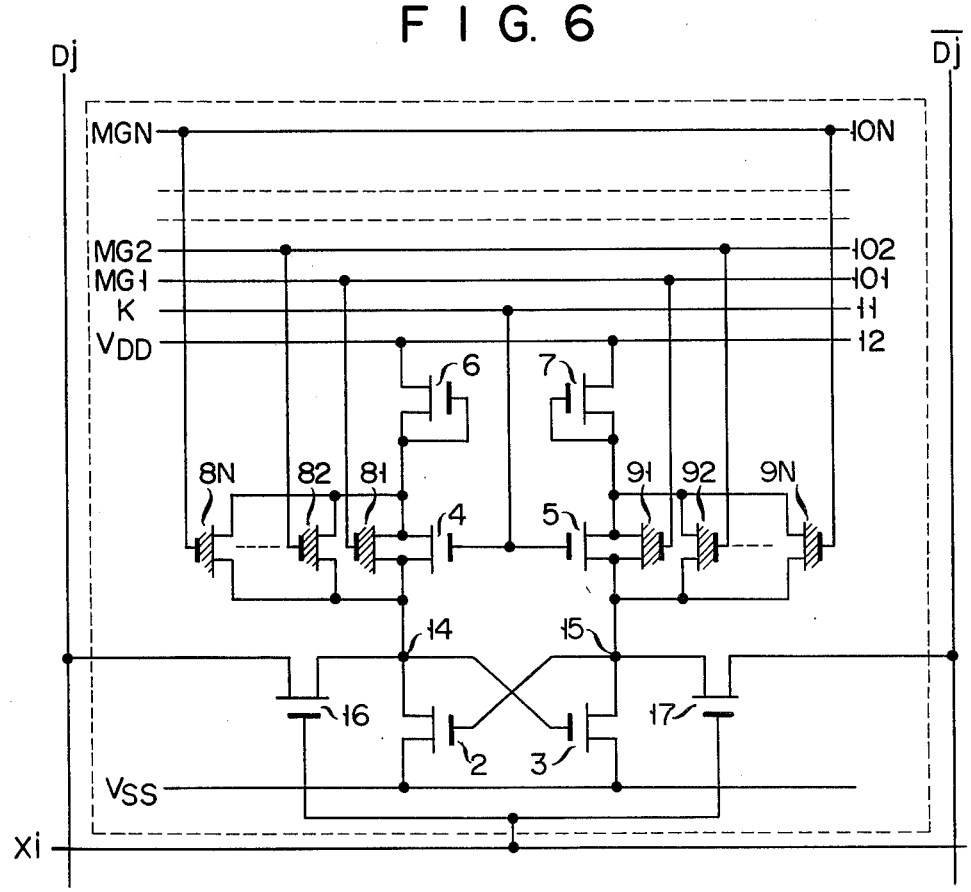

FIG. 6 is a circuit for showing a unit memory cell as used in a nonvolatile memory system according to another embodiment of this invention.

Figure 1:
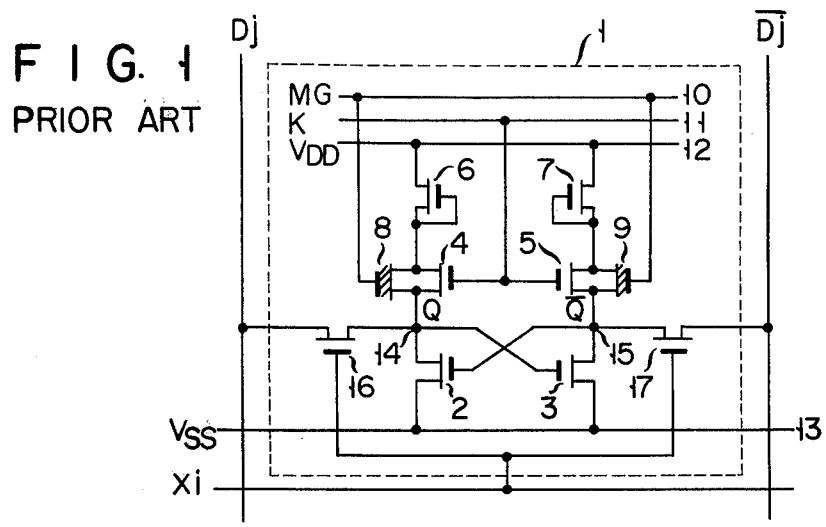
FIG. 1 is a circuit diagram showing a unit memory cell as used in a nonvolatile memory system according to one embodiment of this invention.

In FIG. 1 a unit memory cell includes a bistable circuit and first and second switching transistors. The bistable circuit includes enhancement mode MOS transistors 2, 3, 4 and 5, depletion mode MOS transistors 6 and 7 and variable threshold field effect transistors 8 and 9. The transistors 2, 4 and 6 as well as the transistors 3, 5 and 7, are connected in series and one electrode of each of the transistors 2 and 3 is connected to a ground voltage $V_{SS}$ line 13. One electrode of each of the transistors 6 and 7 is connected to a power source $V_{DD}$ line 12. The gates of the transistors 4 and 5 are connected to a gate control signal K line 11 and the variable threshold field effect transistors 8 and 9, for example, P-channel MNOS transistors (hereinafter referred to as MNOS transistors) are connected in parallel with the transistors 4 and 5, respectively. The gates of the transistors 8 and 9 are connected to a MNOS transistor control signal MG line 10. Two bistable output points are indicated at 14 and 15 in FIG. 1. The bistable output points 14 and 15 are connected through first and second switching transistors 16 and 17 to digit lines Dj and $\overline{Dj}$, and the gates of the transistors 16 and 17 are connected to a word line Xi. With Q representing an output on the bistable point 14, an output on the bistable point 15 is expressed by $\overline{Q}$. The MG line 10 is connected to a control signal generator, not shown, which can produce a MNOS transistor control signal even when the power source $V_{DD}$ is ON.

Figure 2:
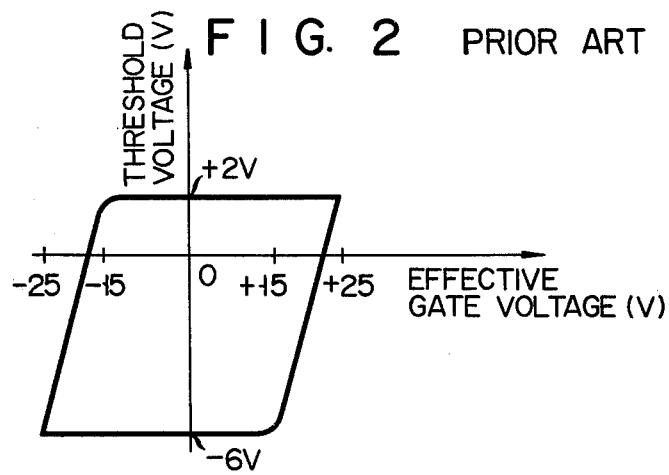
FIG. 2 is a curve showing the characteristic of a variable threshold field effect element in FIG. 1.

The MNOS transistor 8 or 9 has a characteristic as shown in a graph in FIG. 2 where effective gate voltage V is plotted as abscissa and threshold voltage as ordinate. When a 1 m sec. pulse with 25 V is applied to the gate of the MNOS transistor with respect to a substrate potential, the threshold voltage goes in the positive direction and becomes +2 V. When on the other hand a 1 m sec. pulse with −25 V is applied to the gate of the MNOS transistor with respect to the substrate potential, the threshold voltage goes in the negative direction and becomes −6 V. The threshold voltage is held in the "set" position unless a voltage sufficient to change one threshold voltage value of the MNOS transistor to the other threshold voltage value, for example, +15 V or −15 V is applied to the gate of the MNOS transistor with respect to a substrate or a channel potential.

All the MOS transistors in FIG. 1 may be of N channel type or P-channel type. In this embodiment, use is made of P-channel transistors formed on an N-type substrate having an impurity concentration of $10^{15}$ cm$^{-3}$. In the enhancement mode a threshold voltage of −1.5 V is used, while in the depletion mode a threshold voltage of +5 V is used. Suppose that the ground voltage $V_{SS}$ is "0" V. Then, the unit memory cell is operated at the power source voltage $V_{DD}$ of −20 V.

A conventional unit memory cell is substantially similar to that shown in FIG. 1, but it is different from the latter in the following point. In the conventional unit memory cell, data at bistable points are stored in MNOS transistors when the power source is OFF, and the stored data is supplied to the bistable points when the power source is again ON. A MNOS transistor control signal is generated only in interlock with the ON and OFF of a power source $V_{DD}$.

The control of the conventional memory cell will be briefly explained to facilitate an understanding of this invention.

Figure 3:
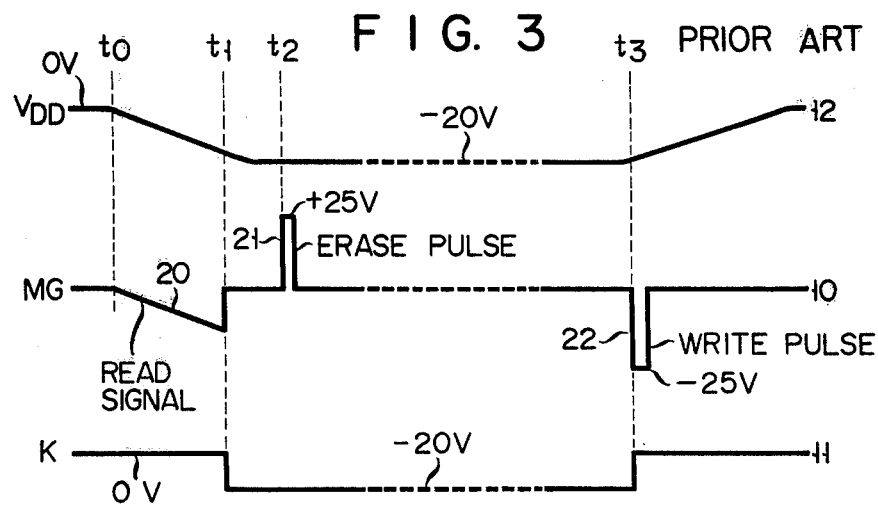
FIG. 3 is the waveform of a signal for driving a conventional unit memory cell.

FIG. 3 shows various waveforms used in controlling the conventional unit memory. Reference is invited to FIGS. 1 and 2. Suppose that with $V_{MT1}$ and $V_{MT2}$ representing the threshold voltages of the MNOS transistors 8 and 9, respectively, a data "1" is stored in the MNOS transistors 8 and 9 at $V_{MT1} = +2$ V and $V_{MT2} = -6$ V, that a data "0" is stored in the MNOS transistors 8 and 9 at $V_{MT1} = -6$ V and $V_{MT2} = +2$ V, and that the data in the MNOS transistors 8 and 9 is erased at $V_{MT1} = V_{MT2} = +2$ V. The stored data of the bistable circuit is defined here by a combination of potentials $V_Q$ and $\overline{V}_Q$ of outputs Q and $\overline{Q}$ on the bistable points 14 and 15. That is, the bistable circuit stores a data "1" at $V_Q = -15$ V and $\overline{V}_Q = -15$ V and $\overline{V}_Q = 0$ V and a data "0" at $V_Q = 0$ V and $\overline{V}_Q = -15$ V. When in this case the power source $V_{DD}$ is OFF, such data is erased.

A power source voltage detection circuit, not shown, is adapted to detect whether the power source $V_{DD}$ is ON (−20 V) or OFF (0 V). In FIG. 3, when the power source $V_{DD}$ becomes ON, a potential on the $V_{DD}$ line 12 gradually approaches −20 V. The power source is in the OFF state (0 V) at $t = t_0$ and in the ON state at $t = t_1$. At time $t_1$, the potential becomes substantially −20 V. At time $t_0$ to $t_1$ read signal 20 having substantially the same slope as that obtained upon recovery of the power source is generated from the power source voltage detection circuit. The signal 20 is supplied to the MG line 10. Up to time $t_1$, a gate control signal K supplied to the K line 11 is held at the "0" volt and the MOS transistors 4 and 5 are rendered nonconductive. The source potentials of the MNOS transistors 8 and 9, i.e., the potentials on the bistable output points 14 and 15 are changed through the MNOS transistors 8 and 9 according to the change at time $t_0$ to $t_1$ of the power source voltage, i.e., a change in the voltage of the read signal 20. When the stored data of the MNOS transistors 8 and 9 are at the "1" level, i.e., $V_{MT1} = +2$ V and $V_{MT2} = -6$ V, the MOS transistor 3 is turned on earlier than the MOS transistor 2, and the potential on the point 15 becomes "0" while the potential on the point 14 becomes a negative potential. In consequence, the bistable circuit stores a data "1". When, on the other hand, the stored data of the MNOS transistors 8 and 9 are at the "0", i.e., $V_{TM1} = -6$ V and $V_{MT2} = +2$ V, the MOS transistor 2 is turned ON earlier than the MOS transistor 3 and the potential on the point 14 becomes "0" volt and the potential on the point 15 becomes a negative potential. As a result, the bistable circuit stores a data "0". Therefore, at time $t_1$ the data which has been stored in the MNOS transistors are transferred to the bistable points. When at time $t_1$ the gate control signal K is −20 V, the MOS transistor 4 and 5 are rendered conductive and the bistable circuit acts as an ordinary MOS type static memory cell. When at any time, for example $t_2$, of $t_1$ to $t_3$, i.e., the ON state of the power source $V_{DD}$ a 1 msec erase pulse 21 having +25 V is applied to the MG line 10, the MNOS transistors 8 and 9 are set in the erase state, i.e., $V_{MT1} = V_{MT2} = +2$ V, ready for the data on the bistable points to be written into the MNOS transistors 8 and 9. When at time $t_3$ the turning OFF of the power source is detected by the power source voltage detection circuit, a 1 msec write pulse 22 having −25 V is applied to the MG line 10 in response to the detection signal and the gate control signal K is changed to "0" V.

If a data "1" is stored in the bistable circuit, i.e., −15 V is on the bistable point 14 and 0 V is on the bistable point 15, when the write pulse 22 is applied to the MG line 10, the threshold voltage $V_{MT2}$ is shifted to −6 V, since the write operation to the MOS transistor 9 is conducted when its source voltage is "0" volt. Since, on the other hand, the source voltage of the MNOS transistor 8 is −15 V, the effective gate voltage of the transistor 8 becomes −25 V−(−15 V)=−10 V. As will be apparent from FIG. 2, the threshold voltage $V_{MT1}$ of the MNOS transistor 8 is held at +2 V without change. That is, also in the write-in-operation the data on the bistable points are written into the MNOS transistor with a correct relationship.

As will be apparent from the above explanation the data is transferred from the bistable points to the MNOS transistors in the unit memory cell, and vice versa. In the conventional unit memory cell, therefore, the transfer of data stored in a pair of MNOS transistors to the bistable points can be effected only when the transfer of the power source from the OFF state to the ON state is detected by the power source voltage detection circuit. In this case it is necessary to generate from the power source voltage detection circuit a read signal having substantially the same variation curve as that obtained when the power source is shifted from the "OFF" state to the "ON" state. However, such power source voltage detection circuit is complicated in construction. It is important to note that in the conventional unit memory cell the stored data of the MNOS transistors can not be read at any desired time onto the bistable points in the bistable circuit with the power source held in the ON state. Therefore, the conventional unit memory cell finds a limited application.

In the memory cell according to this invention the stored data of the MNOS transistors can be read at any desired time during "ON" state of the power source onto the bistable points in the bistable circuit. When the data readout is effected at the ON time of the power source, the potentials or levels on the bistable points needs to be preliminarily set at a reference potential, for example 0 V. In the conventional memory system no means is provided for causing the bistable points in any desired unit memory cell to be set to a reference potential at any desired time. Since in the conventional unit memory cell the data are read out from the MNOS transistors when the power source is changed from the OFF state to the ON state, such a reference level setting means is not necessarily required. That is, because of the relatively long duration of the OFF state of the power source a charge on the bistable point is, for example, discharged, i.e., leaks into a substrate adjacent to the MOS transistor and in consequence the bistable point is set to a reference level, i.e., a zero potential. However, at least 100 msec is required for a potential on the bistable point to become a zero potential. It is therefore difficult to read out a data at any proper time.

One embodiment of this invention as using the unit memory cell in FIG. 1 will be explained by reference to the drawings. In this embodiment the level of the power source $V_{DD}$ is shown as a logical "1" ($V_{DD}$=−20 V) and the ground level $V_{SS}$ as a logical "0" ($V_{SS}$=0 V). P-channel type transistors are used in the circuit. A random access memory matrix array shown in FIG. 4B is constructed as a 256 (=6×6) words×1 bit configuration. The construction of each unit cell 1 is shown in FIG. 1. In FIG. 4B, reference numerals 201 to 230 designate digit lines of the unit cells as arranged in a column direction and correspond to the lines Dj or $\overline{D}j$ in FIG. 1. Reference numerals 301 to 316 denote word lines of the unit memory cells and correspond to the line Xi in FIG. 1. MOS transistors 501 to 532 are used as loads and connected to the digit lines. A pair of data lines 101, 102 (data is expressed as D, $\overline{D}$) are disposed in the random access memory matrix array, and the digit lines are connected respectively through MOS transistors 601 to 632 to the data line 101 or 102. Y decoders 701 to 716 are placed for selecting a column including cells belonging to the column, and the outputs $Y_1$ to $Y_{16}$ of the decoders are applied to the gates of paired MOS transistors (601, 602), (603, 604) ... (631, 632), respectively. X decoders 801 to 816 are placed for selecting a row including cells belonging to the row, and the outputs $X_1$ to $X_{16}$ of the X decoders 801 to 816 are supplied to lines 301 to 316, respectively. Inputs to the X decoder are represented by $\overset{*}{A}_0$ to $\overset{*}{A}_3$ and inputs to the Y decoder by $\overset{*}{A}_4$ to $\overset{*}{A}_7$, but in general $\overset{*}{A}_i$ may be $A_i$ or $\overline{A}_i$. An address buffer circuit as shown in FIG. 4C is provided with respect to each decoder and it is adapted to convert input address signals $A_i$ (i=0 to 7) to signals $A_i$ and $\overline{A}_i$.

Any predetermined combination signals $A_i$ and $\overline{A}_i$ is inputted to the respective X and Y decoders. By the predetermined combination of the input address signals $A_0$ to $A_7$ one X-decoder and one Y-decoder, each, deliver an output signal, and the output signals of the X- and Y-decoders select a desired unit memory cell which is in turn coupled through the data lines 101 and 102 to an input/output circuit 25 to permit a data read/write operation to be effected with respect to the selected unit memory cell. In this case, the paired transistors 16 and 17 in the unit memory cell are rendered conductive. $D_{in}$ and $D_{out}$ in FIG. 4A represent an input data and output data, respectively. Since the above-mentioned access system is similar to a static random access system of a known volatile memory system, using bistable circuits, further explanation is therefore omitted. As a means for causing the bistable points to be set to a reference level, which is for example $V_{SS}$ level, when data are read out from the MNOS transistors 8 and 9 onto the bistable points, a gate circuit 26 is connected to the data lines 101 and 102 (FIG. 4A). The circuit 26 includes enhancement type MOS transistors 27 and 28 having drains connected to the data lines 101 and 102, respectively, and sources connected to the reference potential, $V_{SS}$ in this case, and gates connected to a line 103 to which a reference level setting signal NR is supplied at a predetermined time. That is, upon supplying the signal NR (See FIG. 5), the bistable points 14 and 15 in a selected unit memory cell are set to the reference level through the data lines 101 and 102 and digit lines connected to the data lines.

A MNOS transistor control signal MG is supplied through the MG line 10 to the gates of the MNOS transistors 8 and 9 in all the unit memory cells, and a gate control signal K from the NAND circuit 29 (FIG. 4A) is fed, at a predetermined time, through the common line 11 to the gates of the MNOS transistors 4 and 5 which are connected in parallel with the MNOS transistors 8 and 9, respectively. The NAND circuit 29 is adapted to receive the reference level setting signal NR and a later described chip selection signal CS and generate a NANDed output, i.e., a gate control signal K.

The X-decoders 801 to 816 and Y-decoders 701 to 716 are each constructed of a NOR circuit. Since an output DC of a cell selection control circuit 30 is applied, together with the address signals $\mathring{A}_0$ to $\mathring{A}_3$, to each of the X-decoders 801 to 816, the X-decoder generates a NORed output of these input signals. The cell selection control circuit 30 is a NAND circuit to which is applied the above-mentioned chip selection instruction signal CS and a signal $\overline{NV \oplus NR}$. The signal $NV \oplus NR$ represents an exclusive OR logic of a later-described signal NV and the reference level setting signal NR. A gate circuit 33 is included in the above-mentioned address buffer circuit (FIG. 4C). When the reference level setting signal NR="1", the gate circuit causes inputs $A_i$ and $\overline{A}_i$ to each decoder to be set to "0" and selects all the cells by cooperation with the cell selection control circuit 30. Reading the stored data of the MNOS transistors 8 and 9 in each unit cell onto the bistable points when the power source $V_{DD}$ is in the ON state (i.e. $V_{DD} = -20$ V) will be explained by referring to FIG. 5. Suppose that at time $T_0$ the signal NV in FIG. 5-5 and reference level setting signal NR in FIG. 5-6 are both set at the "1" level. At NR="1", the gate circuit 33 of the address buffer circuit (FIG. 4C) is operated to cause the output $\mathring{A}_i$ of the buffer circuit to become "0". In consequence, the outputs $X_i$ (i=1 to 16) of the decoders 301 to 316 and outputs $Y_j$ (j=1 to 16) decoders 701 to 716 are all in the "1" level. Since at time $T_0$ NV="1" and NR="1", the cell selection control circuit 30 generates a signal DC having a "0" level. Since the outputs of the X decoders are all at the "1" level, the switching transistors 16 and 17 in each of all the unit memory cells are rendered conductive to permit signals on the bistable points 14 and 15 in each unit memory cell to be coupled to the corresponding digit lines. In this case the digit lines 201, 203 . . . 231 are connected respectively through the MOS transistors 601, 603 . . . 631 to the data line 101, and the digit lines 202, 204 . . . 232 respectively through the MOS transistors 602, 604 . . . 632 to the data line 102. The chip selection instruction signal CS in FIG. 5-3 is held in the "1" level, whenever the cell in the matrix array is selected. At time $T_0$ the reference level setting signal NR in FIG. 5-6 is made at the "1" level and the output K (gate control signal) of the NAND circuit 29 varies at $T_0$ from the level "1" to the level "0" as shown in FIG. 5-9. Since the MOS transistors 4 and 5 of each unit cell are rendered conductive as the result, the bistable points 14 and 15 are electrically disconnected from the power source $V_{DD}$. Since at time $T_0$ the reference level setting signal NR in FIG. 5-6 is set to "1", the MOS transistors 27 and 28 are rendered conductive and the bistable points 14 and 15 in each cell are rapidly set to the reference level $V_{SS}$ (ground potential) through the data lines 101 and 102, digit lines 201 to 232 and MOS transistors 16 and 17. At time $T_1$ the signal NV (FIG. 5-5) is made at the "0" level with the reference level setting signal NR held at the level "1". Because of $\overline{NV \oplus NR} = 0$ in this case, the output signal DC of the NAND circuit 30 is changed to "1". By the cooperation of the NAND circuit 30 and the gate circuit 33 in the buffer circuit (FIG. 4C), the outputs of the X decoders are set to the "0" level and all the cells are electrically disconnected from the digit lines 201 to 232. At time $T_1$, i.e., at the time when the bistable points 14 and 15 in each unit memory cell are electrically disconnected from the power source $V_{DD}$ and set to the reference level and all the digit lines are electrically interrupted from the bistable points, a readout signal 20a having an amplitude of, for example, $-10$ V is supplied from a control signal generator 34 through the MG line 10 to the MNOS transistors (FIG. 5-7). The readout signal 20a, though shown as having a slant waveform, may be a square wave of, for example, $-4$ V, a square wave having a negative voltage greater in absolute value than a positive one of the threshold voltages of the MNOS transistors 8 and 9. In this case, the data of the MNOS transistors can be read onto the bistable points with the power source $V_{DD}$ in the ON state. If at the above-mentioned data readout completion time $T_2$ the reference level setting signal NR is made at the "0" level and signal MG at the "0" level (FIG. 5-7), the output K of the NAND circuit 29 becomes a "1" level. As a result, the MOS transistors 4 and 5 in the unit memory cell are rendered conductive to permit a normal operation of the bistable circuit. Since at time $T_2$, an input signal $\overline{NV \oplus NR}$ to the cell selection control circuit 30 also becomes a "1" level, the output signal DC becomes a "0" ( FIG. 5-10). Thus, the X decoder 801 to 816 and address buffer circuit (FIG. 4C) regain their function. And the following at time $T_2$ et seq. the memory system can be operated as an ordinary MOS static random access memory and the stored data of MNOS transistors 8 and 9 are read ont the bistable points 14 and 15. At time $T_0-T_2$ required for such data readout is of the order of microseconds.

Writing the data on the bistable points in the bistable circuit into the corresponding MNOS transistors will be explained below.

At time $T_3$ the signal NV is made at the "1" level (FIG. 5-5) and an erase pulse 21a and write pulse 22a are sequentially supplied from the control signal generating circuit 34 through the MG line 10 to the gates of the MNOS transistors 8 and 9. Referring again to FIG. 5, at time $T_3$ the signal NV is made at the "1" level (FIG. 5-5) and the signal $\overline{NV \oplus NR}$ becomes "0" with the reference level setting signal NR held in the "0" level. Consequently, the output DC of the cell selection control circuit 30 becomes the "1" level (FIG. 5-10). As a result, the outputs $X_1$ to $X_{16}$ of the X decoders 801 to 816, respectively, are all set to the "0" level and all the bistable point 14 and 15 in each unit cell are electrically interrupted from the corresponding digit line. When at time $T_4$ a 1 msec erase pulse 21a having, for example, $+25$ V is applied to the gates of the MNOS transistors 8 and 9, all the MOS transistors are set at the "erased" state as already explained earlier. If at time $T_6$ a 1 msec write pulse 22a of, for example, $-25$ V is applied through the MG line 10 to the gates of the MNOS transistors 8 and 9, data on the bistable points are written into the corresponding MNOS transistor.

Although the above-mentioned explanation is directed to the case where data on the bistable points in the bistable circuit of all unit cells in the memory array are read out of, or written into, the corresponding MNOS transistors, it is possible to select a single unit cell and to shift the data stored in the MNOS transistors in the cell to the corresponding bistable points of the selected unit cell. In this case, it is only necessary to delete the gate circuit 33 in the address buffer circuit (FIG. 4C). That is, at time $T_0$ to $T_1$ (FIG. 5) only one of the outputs $X_i$ of the decoders 801 to 816 and of the outputs $Y_i$ of the Y decoders 701 to 716 are set to 1 by the output signals $A_i$, $\overline{A}_i$ (i=0 to 7) of the address buffer circuit and all the remaining outputs are set to the "0" level. In consequence, only one unit cell is selected. In this case, the pair of digit lines corresponding to the selected cell are connected to the data lines 101 and 102, respectively, and the bistable points 14 and 15 in the selected unit memory cell is set to the reference level, for example, $V_{SS}$ level. Potentials on the bistable points in each of the remaining unit memory cells are not varied, for charges on the bistable points are stored in a stray capacitance. When at time $T_1$ the read signal 20a is applied to the gates of the MNOS transistors in each unit memory cell, the data of the MNOS transistors in the selected unit memory cell is returned to the bistable points in the bistable circuit and data on the bistable points in the nonselected unit memory cell remains held. Another embodiment including a plurality of pairs of MNOS transistors in a unit memory cell will be explained by referring to FIG. 6.

In the embodiment in FIG. 6, a pair of MOS transistors 4, 5 are connected one in parallel with a parallel circuit of MNOS transitors 81, 82 ... 8N and one in parallel with a parallel circuit of MNOS transistors 91, 92 ... 9N. Corresponding MNOS transistors (81, 91), (82, 92), ... (8N, 9N) are connected to the corresponding lines 101, 102 ... 10N, respectively, and MNOS transistor control signals MG1, MG2 ... MGN are supplied to lines 101, 102 ... 10N, respectively. Control signal generators 34 (FIG. 4A) may be connected to the lines 101, 102 ... 10N, respectively, or a control signal from a single control signal generator may be selected, in a desired timing, through switching means to any selected one of the lines 101, 102, ... 10N. Data on the bistable points in the unit memory cell can be written at a different time into each of the corresponding pairs of MNOS transistors, and the data of the corresponding pair of MNOS transistors can be read at a different time onto each bistable point in the unit memory cell.

According to this invention, the stored data of a variable threshold field effect element, for example, a MNOS transistor can be read at a rapid speed of the order of microseconds, onto the bistable points in the bistable circuit in the unit memory cell with the power source in the "ON" state. Since the conventional memory cell array can be used without modification, no great chip area is required in arranging such cells. According to this invention, control lines are connected to the corresponding memory elements contained in a volatile data memory plane corresponding to a bistable circuit group and in a nonvolatile data memory plane corresponding to a variable threshold field effect element group. By controlling the control lines, data on the volatile data memory plane are shifted to, and stored in, the nonvolatile data memory plane and at any desired time such stored data is shifted to the voltatile data memory plane for data processing. That is, when no error is detected during a certain time period, data at the next check time as stored in the volatile data memory plane are written onto the nonvolatile data memory plane for storage. If on the other hand any error is detected, the data stored in the nonvolatile data memory plane are read onto the bistable points for data processing. In the embodiment shown in FIG. 6, in particular, mutually differing program data are preliminarily written onto the nonvolatile data memory plane and at a desired time a desired program data can be read onto the volatile data memory plane.

As the variable threshold field effect element, use may be made of MIOS transistors or any other elements having a nonvolatile memory effect. For example, use can be made of a MIOS transistor, a tunnel injection floating gate transistor, and a capacitor or a diode having a variable threshold voltage field effect characteristic. Such a two-terminal element is connected at one end to the bistable point and at the other end to the control signal line (MG). As a means for causing the bistable points in the bistable circuit to be set to the reference level, the gate circuit 26 as shown in FIG. 4A can be connected to each pair of digit lines.

This invention is also applied to the case that one of the paired variable threshold field effect elements is substituted by the fixed threshold field effect element.

And this invention is also applied to the case that both of the paired variable threshold field effect elements are substituted by the fixed threshold field effect elements, whose threshold voltages are different between them.

What is claimed is:

1. A nonvolatile memory system including a plurality of unit memory cells arranged in a matrix array, each unit memory cell including a bistable circuit and first and second switching transistors, said bistable circuit having a pair of bistable points, at lease one pair of variable threshold field effect elements each having a first electrode connected to a corresponding bistable point, and first electrodes of said first and second transistors being connected to the bistable points respectively, said memory system further comprising:

a plurality of pairs of digit lines, each pair being connected to corresponding second electrodes of the first and second switching transistors in each unit memory cell in the column direction of the memory matrix array;

a plurality of word lines, each, connected in common to the gates of the first and second switching transistors in each unit memory cell in the row direction of the memory matrix array;

a first decoder for selecting at least one pair from said plurality of pairs of digit lines;

a second decoder for selecting at lease one of said plurality of word lines;

a pair of data lines for transferring data to at least one pair of digit lines selected by the output of the first decoder;

control signal generating means for supplying a control signal to the variable threshold field effect elements in each unit memory cell;

first means for selecting at least one unit memory cell through said first and second decoders;

second circuit means external to said unit memory cells for causing both bistable points in the selected cell or cells to be set to ground level through the digit lines; and third means for causing a readout signal from the control signal generating means to be supplied to each variable threshold field effect element after the bistable points are set to ground level.

2. A nonvolatile memory system according to claim 1, in which said first means includes a plurality of address buffer circuits for generating a pair of complementary signals in response to the input address signal so as to supply them to said first and second decoders.

3. A nonvolatile memory system according to claim 2, in which said address buffer circuit further comprises a gate circuit for making the output signal at a predetermined level upon receipt of a cell selection control signal so as to select all the unit memory cells.

4. A nonvolatile memory system according to claim 1, in which said second means includes a pair of switching transistors having first electrodes connected to the pair of data lines, second electrodes set at the reference level, and gate electrodes adapted to be controlled by a ground level setting signal.

5. A nonvolatile memory system according to claim 1, in which said second means includes a plurality of pairs of switching transistors, each pair of switching transistors each having first electrode connected to a corresponding one of the pair of the digit lines, second electrodes set to the ground level and gates adapted to be controlled by a reference level setting signal.

6. A nonvolatile memory system according to claim 1, in which said bistable circuit includes a pair of field effect elements, said control signal generating means comprises a single control signal generator, and the field effect elements in each unit memory cell is controlled by an output signal from the single control signal generator.

7. A nonvolatile memory system according to claim 1, in which said bistable circuit includes a plurality of pairs of field effect elements, said control signal generating means comprises a plurality of control signal generators, and the corresponding pairs of field effect elements are commonly controlled by an output signal from a corresponding control signal generator.

8. A nonvolatile memory system according to claim 1, in which said bistable circuit comprises a pair of bistable points, at least one pair of variable threshold field effect elements each having a first electrode connected to a corresponding bistable output point and a second electrode connected through a load to a power supply source, and another pair of switching transistors connected in parallel with the pair of variable threshold field effect elements and adapted to be controlled at a desired time to effect an interruption between the bistable points and the power source.

9. A nonvolatile memory system comprising:
a memory array including a plurality of unit memory cells arranged in a matrix array, each unit memory cell comprising a bistable circuit having a pair of bistable points, at least one pair of semiconductor memory elements each having a first electrode connected to a corresponding bistable point and, first and second switching transistors, first electrodes of said first and second transistors being connected to the bistable points respectively;
a plurality of pairs of digit lines, each pair being connected one to a corresponding second electrode of the first and second switching transistors in each unit memory cell in the column direction of the memory matrix array;
a plurality of word lines, each connected in common to the gates of the first and ssecond switching transistors in each unit memory cell in the row direction of the memory matrix array;
a first decoder for selecting at least one pair from said plurality of pairs of digit lines;
a second decoder for selecting at least one of said plurality of word lines;
a pair of data lines for transferring data to at least one pair of digit lines selected by the output of the first decoder;
control signal generating means for supplying a control signal to the semiconductor memory elements in each unit memory cell;
first means for selecting at least one memory cell through said first and second decoders;
second means external to said unit memory cells for causing both bistable points in the selected cell or cells to be set to ground level through said digit lines; and
third means for causing a readout signal from the control signal generating means to be supplied to each semiconductor memory element after the bistable points are set to the reference level.

10. A nonvolatile memory system according to claim 9, wherein one of each paired semiconductor memory elements has a fixed threshold voltage value and the other has two variable threshold voltage values, one being larger than the fixed threshold voltage value and the other being smaller than the fixed threshold value, said voltage values being absolute values.

11. A nonvolatile memory system according to claim 9, wherein one of each paired semiconductor memory elements has a first valued threshold voltage and the other has a second valued threshold voltage.

* * * * *